United States Patent [19]

Ong

[11] 4,165,507
[45] Aug. 21, 1979

[54] NON-LINEAR DIGITAL TO ANALOG CONVERSION BY INTERMEDIATE CONVERSION TO TIME INTERVAL

[75] Inventor: Kian K. Ong, Eindhoven, Netherlands

[73] Assignee: U.S. Philips Corporation, New York, N.Y.

[21] Appl. No.: 730,674

[22] Filed: Oct. 7, 1976

[30] Foreign Application Priority Data

Oct. 9, 1975 [NL] Netherlands ................. 7511840

[51] Int. Cl.² ............................. H03K 13/20
[52] U.S. Cl. ..................... 340/347 DA; 334/11
[58] Field of Search .................. 358/286–293; 328/186; 307/227, 228; 340/347 DA; 334/11

[56] References Cited

U.S. PATENT DOCUMENTS

| 3,412,267 | 11/1968 | Bohle | 307/228 |
| 3,418,490 | 12/1968 | Hofferber | 307/228 |
| 3,581,116 | 5/1971 | Leostic | 307/227 |
| 3,918,046 | 11/1975 | Rivers | 340/347 DA |

*Primary Examiner*—Charles D. Miller
*Attorney, Agent, or Firm*—Thomas A. Briody; Edward J. Connors, Jr.; James J. Cannon, Jr.

[57] ABSTRACT

A circuit network for the non-linear digital-to-analog conversion of a periodic pulse signal having a linear average value which depends on a digital value into a direct current signal, wherein said network has different charge and discharge time constants for the pulse signals and the smoothing filter, so that a non-linear relation is obtained between the value of the input signal and the amplitude of the output signal of the filter circuit. The input network includes in series a resistor and a capacitor, the resistor of which is shunted at least partially by a diode.

6 Claims, 2 Drawing Figures

NON-LINEAR DIGITAL TO ANALOG CONVERSION BY INTERMEDIATE CONVERSION TO TIME INTERVAL

BACKGROUND OF THE INVENTION

The invention relates to a digital-to-analog converter comprising a converting circuit in which a digital signal is converted into a periodical pulse signal from which a direct current signal is obtained by means of a filter circuit which filter circuit has an input circuit which has for the pulse signal a charge time constant which differs from the discharge time constant so that a non-linear relation is obtained between the value of the input signal and the amplitude of the output signal of the filter circuit.

The Dutch Patent Application No. 7 401 003 discloses a converting circuit of the above-mentioned type which is part of an analog-to-digital converter. Therein the input circuit of the filter circuit is constituted by a balanced amplifier having a series circuit of two transistors which are driven by two complementary transistors the collector circuits of which drive the smoothing filter, a series resistor being included in one of those collector circuits.

It is an object of the invention to provide a simpler and cheaper circuit.

SUMMARY OF THE INVENTION

According to the invention a converting circuit of the type mentioned in the preamble is therefore characterized in that the input circuit is a series circuit of a resistor and a capacitor, the resistor of this circuit being shunted at least partially, by a diode.

As a result the circuit is simple and cheap and, furthermore, if so desired, it is capable of transferring amplitude variation of the input signal to its output.

The circuit according to the invention can be realized in a simple manner as will be clear from the following description of the drawing.

DESCRIPTION OF THE PREFERRED EMBODIMENT

Figure 1:
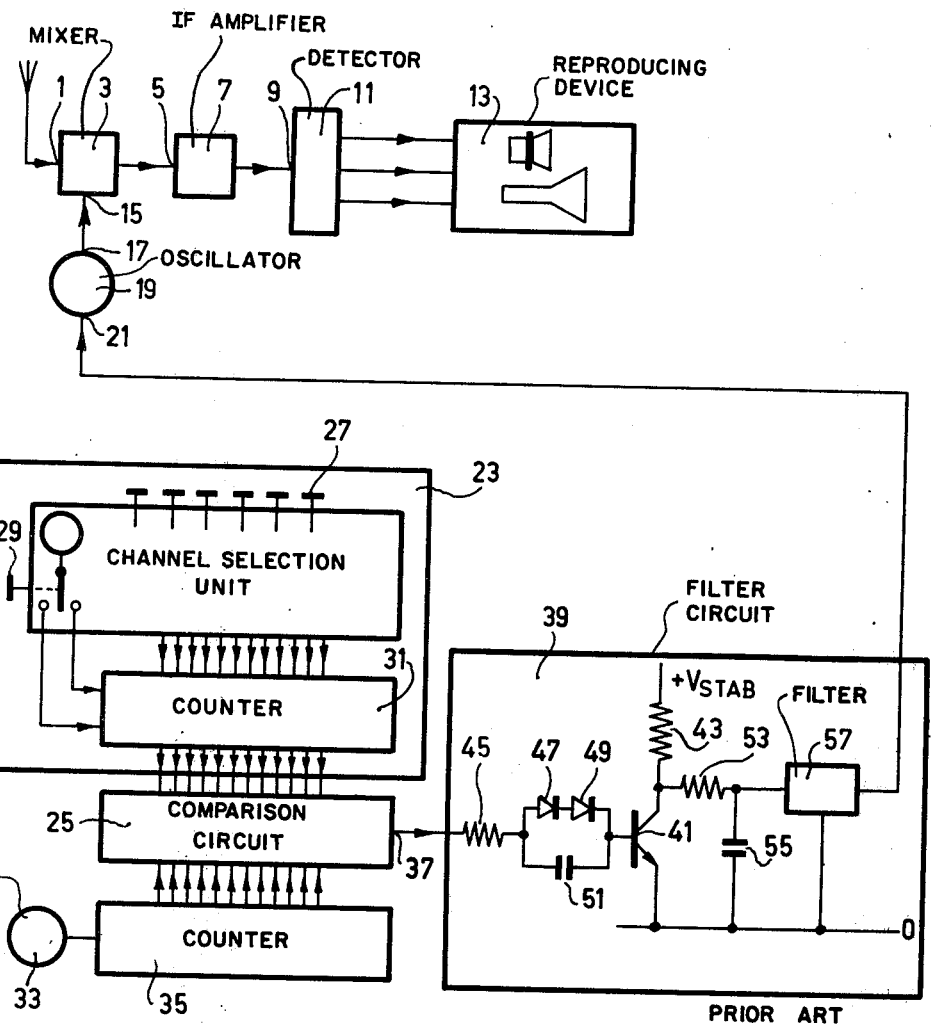
FIG. 1 shows a receiver having a tuning circuit which comprises a prior art circuit and FIG. 2 shows a filter circuit for a converting circuit according to the invention.

In FIG. 1 a high frequency signal is supplied to an input 1 of the high frequency and mixing section 3 of a receiver. This signal is converted by the section 3 into an intermediate frequency signal which is fed to an input 5 of an intermediate frequency amplifier 7. An amplified intermediate frequency signal is supplied to an input of a detection and decoder circuit 11 which supplies signals which are suitable for reproduction to a reproducing device 13. The reproducing device 15 may reproduce sound only for radio reception or sound and image for television reception.

An oscillator signal derived from an output 17 of an oscillator 19 is supplied to a further input 15 of the high frequency and mixer section 3. The oscillator 19 comprises a voltage or current dependent tuning element which can be influenced by a tuning voltage supplied to a tuning signal input 21.

The tuning voltage supplied to the tuning signal input 21 is derived from a converting circuit which is constructed as a digital-to-analog converter. The latter comprises a control device 23 which supplies a digital signal combination to a comparison circuit 25. This digital signal combination can be obtained because the counter 31 is adjusted to a given position under the influence of a plurality of channel selection keys 27 or under the influence of a station of search tuning.

The digital signal combination is supplied to a comparison circuit 25 to which also a digital signal combination is supplied from a counter 35 which continuously operates under the influence of clock pulses from a clock pulse generator 33.

Then the comparison circuit 25 delivers a periodical pulse signal at an output 37, the average value of which is proportional to the desired numerical value adjusted in the control device 23.

This pulse signal is supplied to an input circuit of the filter circuit 39. This input circuit comprises a transistor 41 which is connected as a switch, the collector of the transistor is connected via a resistor 43 to a stabilized voltage $+V_{stab}$, the emitter is grounded and the base is driven by the pulse signal via a resistor 45 is series with the parallel circuit of two diodes 47, 49 and the capacitor 51. This resistor 45, the diodes 47, 49 and the capacitor 51 serve to obtain a rapid switch-over without disturbing phenomena of the transistor switch 41 on the edges of the pulse signal. Via a resistor 53 the collector of the transistor 41 is connected to a capacitor 55 whose other terminal is connected to ground and to an input of a smoothing filter 57, the output of which is connected to the tuning signal input 21 of the oscillator 19.

The resistors 43, 53 and the capacitor 55 constitute together with the transistor 41 a network whose charge time constant in a non-conducting state of the transistor 41 is constituted by the resistor 43, the resistor 53 and the capacitor 55 and the discharge time constant in a conducting stage of the transistor 41 by the resistor 53 and the capacitor 55. These time constants are chosen to be large with respect to the period of the pulse signal. It appears that the average voltage across the capacitor 55 now depends in a nonlinear manner on the average value of the pulse signal and the output 37 of the comparison circuit 25.

To obtain a uniform change in the tuning frequency of the oscillator 19 by the digital value supplied to the comparison circuit 25 in the case the tuning element of this oscillator is a so-called varicap or capacitance diode, the ratio between the value of the resistor 43 to that of the sum of the values of the resistor 43 and the resistor 53 is taken smaller than one for the UHF band of a TV receiver.

If the pulse signal is generated by means of the TTL logic the following values may be used:

$R_{45} = 1$ k 2 $\Omega$
$C_{51} = 100$ k pF $= 0.1$ $\mu$F
$D_{47,49} = $ BAX 13
$T_{41} = $ BSX 19
$T_{43} = 33$ k$\Omega$
$R_{53} = 10$ k$\Omega$ $C_{55}$ is matched to the frequency of the pulse signal and may, for example, amount to a number of $\mu$F at 500 Hz The load which the filter 57 exercises on the network should be as small as possible.

If in an input circuit of a filter circuit 39 the transistor 41 is connected as emitter follower, the resistor 43 being the emitter resistor, an opposite non-linearity is obtained.

The nature of the influence of the pulse signal by the digital value to be converted may be a change in the number of pulses per period, a change in the pulse width or a combination of them, while further, if so desired a combination may be used with pulse amplitude modulation for which measures must then be taken to make the circuit also sensitive to amplitude.

Figure 2:
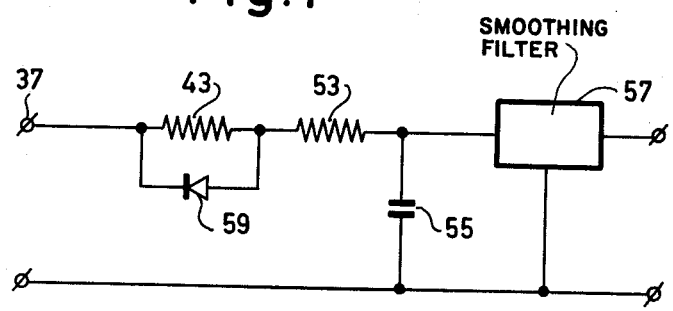

This is, for example, the case when an input circuit of FIG. 2 is controlled by a pulse signal whose amplitude can be varied.

Corresponding elements in FIG. 2 are given the same reference numerals as in FIG. 1. Now the resistor 43 is directly controlled by the pulse signal source and is shunted by a diode 59 which causes the discharge time constant to be smaller than the charge time constant. If the diode 59 is reversed then the discharge time constant becomes larger than the charge time constant.

It will be clear that in the case an input circuit according to FIG. 2 is used also a pulse signal without amplitude modulation may be used.

Although in the above a non-linear converter according to the invention in a tuning circuit was discussed by way of embodiment it should be realized that the use of these converters is not limited to this use. For example, their use in control or setting circuits to correct the control or setting characteristic is often expedient.

Besides the oscillator it will be evident that also the high frequency section of the receiver may comprise one or more tuning elements which can be influenced by the tuning voltage.

I claim:

1. An improved digital-to-analog converter in which a digital signal is converted into a periodical pulse signal and than filtered to yield a direct current, said converter including an input means which converts a digital signal to a periodical pulse signal, a filter circuit including a filter for converting a pulse signal to direct current which serves as an input to an oscillator, wherein the improvement comprises:
   an electrical network which receives as input a periodical pulse signal and outputs a signal to said filter having for said pulse signal a charge time constant differing from its discharge time constant such that a non-linear relation is obtained between the value of the input signal to said network and the amplitude of the output signal of said filter circuit;
   said network serving as the input circuit to said filter, comprising:
   an input means to receive said periodical pulse signals;
   a first resistive means connected to said input means;
   a diode connected in parallel with said first resistive means;
   second resistive means connected in series to the output of said first resistive means and said diode;
   capacitive means connected in series to the output of said second resistive means and the input to said filter; said diode serving to shunt at least partially said resistive means;
   the output of said capacitive means being the output of said network and serving as input to said filter;
   said filter having an input means connected in series with the output of said network, said filter serving to smooth the signal applied to its input.

2. A converter as defined in claim 1 wherein said first resistive means comprises a resistor connected in series between said input means and said second resistive means of said filter circuit.

3. A converter as defined in claim 1 wherein said second resistive means comprises a resistor connected in series between said first resistive means and said capacitive means of said filter circuit.

4. A converter as defined in claim 1 wherein said charge time constant and said discharge time constant are related such that a non-linear relationship exists between the average value of said input periodical pulse signal and the average voltage across said capacitive means.

5. A converter as defined in claim 1 wherein the discharge time constant is smaller than the charge time constant.

6. A converter as defined in claim 1 further comprising:
   oscillator means having an input connected to the output of said filter circuit, said oscillator means having adjustable tuning means controlled by the voltage supplied to said input of said oscillator means.

* * * * *